US012605744B2

(12) United States Patent
Shi et al.

(10) Patent No.: US 12,605,744 B2
(45) Date of Patent: Apr. 21, 2026

(54) SILICON BAR RINSING DEVICE

(71) Applicant: TCL ZHONGHUAN RENEWABLE ENERGY TECHNOLOGY CO., LTD., Tianjin (CN)

(72) Inventors: Yan Shi, Tianjin (CN); Zhihui Liang, Tianjin (CN); Yiqiang Gong, Tianjin (CN); Meng Wang, Tianjin (CN); Xiaopeng Wang, Tianjin (CN); Shusheng Yang, Tianjin (CN); Yanhui Zhao, Tianjin (CN); Shun Chang, Tianjin (CN); Wei Zhao, Tianjin (CN); Kun Yin, Tianjin (CN); Guangyu Wang, Tianjin (CN); Xizhen Li, Tianjin (CN)

(73) Assignee: TCL ZHONGHUAN RENEWABLE ENERGY TECHNOLOGY CO., LTD., Tianjin (CN)

(*) Notice: Subject to any disclaimer, the term of this patent is extended or adjusted under 35 U.S.C. 154(b) by 271 days.

(21) Appl. No.: 18/548,093

(22) PCT Filed: Jun. 29, 2023

(86) PCT No.: PCT/CN2023/103940
§ 371 (c)(1),
(2) Date: Aug. 27, 2023

(87) PCT Pub. No.: WO2024/021994
PCT Pub. Date: Feb. 1, 2024

(65) Prior Publication Data
US 2025/0033092 A1     Jan. 30, 2025

(30) Foreign Application Priority Data
Jul. 29, 2022    (CN) .......................... 202221983677.8

(51) Int. Cl.
*B08B 3/02*        (2006.01)
*B08B 5/02*        (2006.01)
(Continued)

(52) U.S. Cl.
CPC .................. *B08B 3/02* (2013.01); *B08B 5/02* (2013.01); *C30B 15/00* (2013.01); *C30B 29/06* (2013.01); *C30B 33/00* (2013.01)

(58) Field of Classification Search
None
See application file for complete search history.

(56) References Cited

U.S. PATENT DOCUMENTS 6,115,541 A  *  9/2000  Rhodes ..................... B08B 3/02
                                                    134/96.1
2002/0162575 A1   11/2002  Fratello et al.

FOREIGN PATENT DOCUMENTS

CN        203854109 U     10/2014
CN        212633594 U      3/2021
(Continued)

OTHER PUBLICATIONS

KR20090010072U Espacenet translation, Machine for washing foods, Park (Year: 2009).*
(Continued)

*Primary Examiner* — Cristi J Tate-Sims
(74) *Attorney, Agent, or Firm* — PV IP PC; Christopher S. Ruprecht; Wei Te Chung

(57)        ABSTRACT

The present disclosure provides a silicon bar rinsing device comprising: a rinsing portion, wherein the rinsing portion is a cavity having a upper opening and is configured to rinse the silicon bar; an adjusting portion disposed in the rinsing portion; a compressed air pipeline disposed on a side of the rinsing portion and communicated with the rinsing portion; a reuse water pipeline disposed on an other side of the
(Continued)

rinsing portion opposite to the compressed air pipeline and communicated with the rinsing portion; and a control unit disposed on a upper end of the rinsing portion and configured to control turning on or off of the silicon bar rinsing device.

17 Claims, 1 Drawing Sheet

(51) Int. Cl.
    *C30B 15/00*     (2006.01)
    *C30B 29/06*     (2006.01)
    *C30B 33/00*     (2006.01)

(56)           References Cited

FOREIGN PATENT DOCUMENTS

| | | | |
|---|---|---|---|
| CN | 112845475 | A | 5/2021 |
| CN | 213287850 | U | 5/2021 |
| CN | 114192479 | A | 3/2022 |
| CN | 215918396 | U | 3/2022 |
| CN | 218531988 | U | 2/2023 |
| FR | 2662100 | A1 | 11/1991 |

OTHER PUBLICATIONS

International Search Report in International application No. PCT/CN2023/103940, mailed on Sep. 25, 2023.
Written Opinion of the International Search Authority in International application No. PCT/CN2023/103940, mailed on Sep. 25, 2023.

* cited by examiner

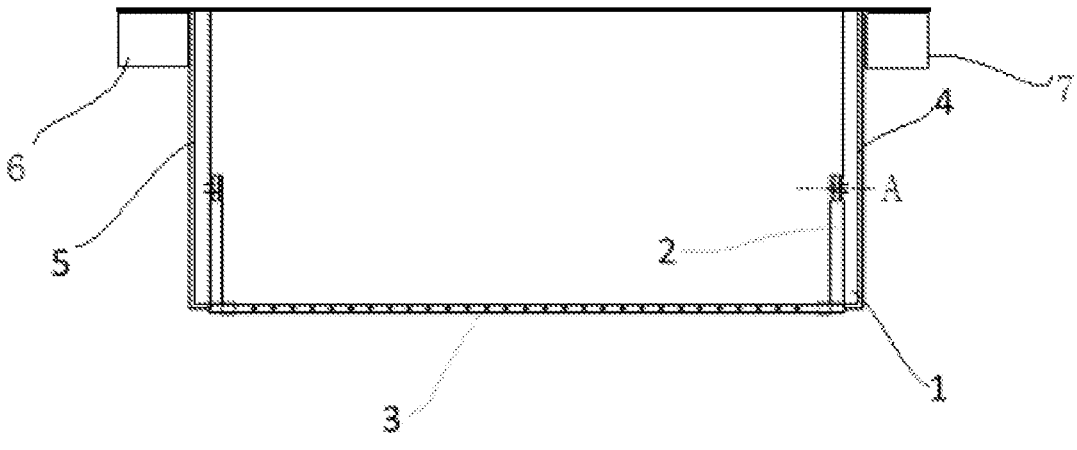

SILICON BAR RINSING DEVICE

CROSS-REFERENCE TO RELATED APPLICATION

This application claims priority to and the benefit of Chinese Patent Application No. 202221983677.8, filed on Jul. 29, 2022, the disclosure of which is incorporated herein by reference in its entirety.

TECHNICAL FIELD

The present disclosure relates to the field of auxiliary equipment for preparing Czochralski monocrystalline silicon, and in particular, relates to a silicon bar rinsing device.

BACKGROUND

During the preparation of Czochralski monocrystalline silicon, a large amount of silicon sludge and debris is generated in efficient cutting and processing of silicon bars. The silicon sludge and debris are easily adsorbed on the surfaces of the silicon bars or enter into the processing equipment, thereby adversely affecting the production. Also, environmental cleanliness of the workshop may be low due to the silica sludge and debris during the transfer of the silicon bars, which is easy to pollute other silicon bars and is unfavorable to production efficiency.

SUMMARY

An object of the present disclosure is to solve the problems in the prior art that a large amount of silicon sludge and debris generated during the cutting of silicon bars easily pollute silicon bars or a processing equipment, and cause a relatively low environmental cleanliness of the workshop and pollution to other silicon bars, thereby yielding unfavorable production efficiency. Therefore, the present disclosure provides a silicon bar rinsing device, which is capable of rinsing the cut silicon bars, eliminating silicon sludge debris on the surface of the silicon bars, and then purging the rinsed silicon bars, to allow the silicon bars to be used in a next operation process. The rinsing device ensures the cleanliness of the silicon bars, reduces pollution in the workshop, and improves the production efficiency.

To solve the above technical problems, the present disclosure provides the following technical solutions.

A silicon bar rinsing device comprising:

a rinsing portion, wherein the rinsing portion is a cavity having an upper opening and is configured to rinse the silicon bar;

an adjusting portion disposed in the rinsing portion, wherein the adjusting portion is moveable to adjust a position and an angle of a lower end of the rinsing portion;

a compressed air pipeline disposed on a side of the rinsing portion and communicated with the rinsing portion, wherein the compressed air pipeline is configured to transport and store compressed air to purge the silicon bar;

a reuse water pipeline disposed on another side of the rinsing portion opposite to the compressed air pipeline and communicated with the rinsing portion, wherein the reuse water pipeline is configured to transport and store reuse water to rinse the silicon bar; and a control unit disposed on a upper end of the rinsing portion and configured to control turning on or off of the silicon bar rinsing device.

Further, the device further comprises a plurality of water-air ejecting holes disposed at the lower end of the rinsing portion, wherein the plurality of water-air ejecting holes are configured to eject the reuse water or the compressed air toward the lower end of the rinsing portion.

Further, the water-air ejecting holes are uniformly spaced.

Further, the adjusting portion comprises:

two first connecting rods respectively disposed on left and right sides inside the rinsing portion, wherein upper ends of the first connecting rods are fixedly connected to the upper end of the rinsing portion;

two second connecting rods, wherein an upper end of each of the second connecting rods is moveably connected to one of the first connecting rods, and lower ends of the second connecting rods are fixedly connected to the lower end of the rinsing portion, and moving the second connecting rods is capable to drive the lower end of the rinsing portion to move, so as to change the position and the angle of the lower end of the rinsing portion.

Further, a length of each of the second connecting rods is less than or equal to one half of a length of each of the first connecting rods.

Further, the control unit includes:

a solenoid valve disposed at the upper end of the rinsing portion, and configured to control transport and ejection of the compressed air from the compressed air pipeline and the reuse water from the reuse water pipeline.

Further, the solenoid valve is a direct-acting solenoid valve.

Further, a length of the rinsing portion is greater than or equal to a length of the silicon bar to be rinsed.

Further, the adjusting portion, the compressed air pipeline, and the reuse water pipeline are detachably connected to the rinsing portion.

Further, the device further comprises a sensor, wherein the sensor is configured to detect residual humidity of the purged silicon bar and to feed back.

Compared with the prior art, the present disclosure has the advantages and positive effects that the silicon bar rinsing device designed by the present disclosure is capable of rinsing the cut silicon bars, eliminating silicon sludge debris on the surface of the silicon bars, and then purging the rinsed silicon bars, to allow the silicon bars to be used in a next operation process. The rinsing device ensures the cleanliness of the silicon bars, reduces pollution in the workshop, and improves the production efficiency.

BRIEF DESCRIPTION OF THE DRAWINGS

In order to more clearly illustrate the technical solutions in the embodiments of the present disclosure or prior art, reference will now be made to the accompanying drawings required for the description of the embodiments or the prior art. It will be apparent that the accompanying drawings in the following description are merely some of the embodiments of the present disclosure, and other drawings may be made from these accompanying drawings to those skilled in the art without involving any inventive effort.

FIG. 1 is a schematic structural diagram of a silicon bar rinsing device according to an embodiment of the present disclosure.

LIST OF REFERENCE NUMBERS

1—first connecting rod, 2—second connecting rod, 3—water-air ejecting hole, 4—compressed air pipeline, 5—reuse water pipeline, 6—solenoid valve, 7—sensor.

DETAILED DESCRIPTION OF THE EMBODIMENTS

In order to make the objects, technical solutions and advantages of the present disclosure clearer and more explicit, the embodiments of the present disclosure are described in detail below in conjunction with specific embodiments with reference to the accompanying drawings. It is to be understood that these descriptions are exemplary only and are not intended to limit the scope of the present disclosure. In addition, descriptions of well-known structures and techniques are omitted in the following description to avoid unnecessary confusion of the concept of the present disclosure.

In the description of the present disclosure, it can be understood that orientation or position relationships indicated by terms such as "center", "longitudinal", "lateral", "upper", "lower", "front", "rear", "left", "right", "vertical", "horizontal", "top", "bottom", "inside", and "outside" are based on orientation or position relationships illustrated in the drawings. The terms are used to facilitate and simplify the description of the present disclosure and are relative positions, rather than indicate or imply that the devices or elements referred to herein are required to have specific orientations or be constructed or operate in the specific orientations. Therefore, these terms cannot be construed as limiting the present disclosure.

Referring to FIG. 1, it is a schematic structural diagram of a silicon bar rinsing device according to an embodiment of the present disclosure, wherein the silicon bar rinsing device comprises:

a rinsing portion, which is a cavity with a upper opening and is configured to rinse the silicon bar placed under the silicon bar rinsing device;

an adjusting portion disposed in the rinsing portion, wherein the adjusting portion can move to change a position and angle of a lower part of the rinsing portion, so as to rinse the silicon bar in all directions and remove residual silicon sludge debris from the silicon bar;

a compressed air pipeline 4 disposed on a side of the rinsing portion and communicated with the rinsing portion, wherein the compressed air pipeline 4 is configured to transport and store compressed air. During the rinsing process of silicon bar, the compressed air pipeline 4 supplies compressed air to the rinsing portion, and then the compressed air passes through a lower end of the rinsing portion to purge the rinsed silicon bar, thereby removing a large amount of water on surfaces of the silicon bar and reducing a humidity thereof;

a reuse water pipeline 5 disposed on another side of the rinsing portion opposite to the compressed air pipeline 4 and communicated with the rinsing portion, wherein the reuse water pipeline 5 is configured to transport and store reuse water to rinse the silicon bar. During the rinsing of silicon bar, the reuse water pipeline 5 supplies reuse water to the rinsing portion, and then the reuse water passes through the lower end of the rinsing portion to rinse the silicon bar, thereby removing silicon sludge debris on the respective surfaces of the silicon bar; and a control unit disposed on an upper end of the rinsing portion and configured to control turning on or off of the device. For example, the control unit may control turning on or off of the compressed air pipeline 4 or the reuse water pipeline 5.

Specifically, the device further comprises a plurality of water-air ejecting holes 3. The water-air ejecting holes 3 are disposed at the lower end of the rinsing portion for ejecting the reuse water or the compressed air to the silicon bar toward the lower end of the rinsing portion.

Preferably, the water-air ejecting holes 3 are spaced uniform intervals from each other, thereby uniformly ejecting water during the rinsing process and fully cleaning the silicon bar. Specifically, the adjusting portion comprises:

two first connecting rods 1 respectively disposed on left and right sides inside the rinsing portion, wherein upper ends of the first connecting rods 1 are fixedly connected to the upper end of the rinsing portions;

two second connecting rods 2, wherein an upper end of each of the second connecting rods 2 is movably connected to one of the first connecting rods, and a lower end of each of the second connecting rods 2 is fixedly connected to the lower end of the rinsing portion. The respective second connecting rods 2 can move relative to the first connecting rods 1. For example, the second connecting rods 2 can be rotated in a certain angle range around an axis A, or the second connecting rods 2 can move up and down along an axial direction of the first connecting rods 1, so that the lower end of the rinsing portion may be driven to move, thereby changing the angle and position of the lower end of the rinsing portion.

When the silicon bar under the rinsing portion are subjected to rinsing, the angle and/or position of the water-air ejecting holes 3 at the lower end of the rinsing portion can be changed by adjusting the angle and/or position of the second connecting rods 2, so as to more fully rinse the silicon bar.

Preferably, the length of each of the second connecting rods 2 is less than or equal to one-half of the length of each of the first connecting rods 1. If the second connecting rods 2 have a too long length, a part of each second connecting rod 2 will cross with the corresponding first connecting rod 1, and this will result in a limited distance of movement of the second connecting rods 2 within the rinsing portion, thereby preventing the lower end of the rinsing portion from being adjusted to the desired position and angle.

Specifically, the control unit comprises:

a solenoid valve 6 disposed on the upper end of the rinsing portion and configured to control transport and ejection of the compressed air from the compressed air pipeline 4 and the reuse water from the reuse water pipeline 5.

Specifically, the solenoid valve is electrically connected to the compressed air pipeline 4 and the reuse water pipeline 5.

Preferably, the solenoid valve is a direct-acting solenoid valve.

Specifically, the length of the rinsing portion is greater than or equal to the length of the silicon bar to be rinsed.

Specifically, the adjusting portion, the compressed air pipeline 4, and the reuse water pipeline 5 are detachably connected to the rinsing portion. The detachable connection between the various components of the device allows for better assembly and disassembly according to requirements and allows reuse of these components.

Preferably, the device further comprises a sensor 7, which is disposed on the upper end of the rinsing portion and configured to detect a residual humidity of the purged silicon bar and to provide feedback on whether to continue purging. Specifically, after the silicon bar is cleaned with the reuse water, the solenoid valve 6 is controlled to turn on the compressed air pipeline 4, the compressed air enters into the rinsing portion to purge the cleaned silicon bar. After purging, the current humidity of the silicon bar is detected by the sensor, and the detected result may be fed back to the compressed air pipeline 4. If the humidity is relative high, the compressed air pipeline 4 continues to supply compressed air to purge the silicon bar again, until the humidity of the silicon bar reaches to a predetermined value.

According to the embodiments of the present disclosure, after the silicon bar is prepared and cut into a predetermined length and shape, the cut silicon bar are transferred to the underneath of the device and are controlled to be in a uniform rotation state. Then, the second connecting rods 2 are adjusted to allow the angle of the water-air ejecting holes 3 to be aligned with the silicon bar to be rinsed. The solenoid valve 6 is controlled to turn on the reuse water pipeline 5, the reuse water is supplied into the rinsing portion, and then ejected through the water-air ejecting holes 3 at the lower end of the rinsing portion, to wash the surfaces of silicon bar and to remove the silicon sludge. For example, the used water in the reuse water pipeline 5 is recycled water that passes through a reuse water pool after being settled and filtered and then is delivered to the reuse water pipeline 5. Then, the solenoid valve 6 is controlled to turn off the reuse water pipeline 5 and to turn on the compressed air pipeline 4, the compressed air is supplied into the rinsing portion, and then ejected through the water-air ejecting holes 3 at the lower end of the rinsing portion to purge the surfaces of the washed silicon bar. For example, the compressed air is obtained from the following process: air enters into an air inlet of an air compressor, and then is compressed by the air compressor, ejected from an air outlet of the air compressor into an air storage tank. When the pressure in the air storage tank exceeds a certain limit, the compressed air can be fed into the compressed air pipeline 4, and ejected through the water-air ejecting holes 3, to purge the surfaces of the silicon bar to reduce the humidity of the silicon bar. After the purging, the monocrystalline silicon bar can be transferred to a next step. Preferably, the sensor may be provided to detect the humidity of the purged silicon bar. If the humidity is relative high, and the silicon bar need to be purged, the detected result is fed back to the compressed air pipeline to purge the silicon bar again.

Therefore, the present disclosure has the following advantages and positive effects:

the silicon bar rinsing device according to the present disclosure can perform rinsing on the cut silicon bars to eliminate silicon sludge debris and the like on the surfaces of the silicon bars, can purge the rinsed silicon bars, and then perform a next operation on the silicon bars. The rinsing device ensures the cleanliness of the silicon bars, reduces pollution in the workshop, and improves the production efficiency.

It is to be understood that the above embodiments of the present disclosure are merely illustrative or explanatory of the principles of the present disclosure and are not to be construed as limiting the present disclosure. Accordingly, any modifications, equivalent replacements, improvements and the like should be encompassed in the scope of the present disclosure without departing from the spirit and scope of the present disclosure. Furthermore, the appended claims of the present disclosure are intended to cover all variations and modifications falling within the scope and boundaries or equivalents of such scope and boundaries of the appended claims.

What is claimed is:

1. A silicon bar rinsing device, configured to clean a silicon bar located below an entire structure of the silicon bar rinsing device, and comprising:

a rinsing portion, wherein the rinsing portion is a cavity having an upper opening and is configured to rinse the silicon bar;

an adjusting portion disposed in the rinsing portion, wherein the adjusting portion is moveable to adjust a position and an angle of a lower end of the rinsing portion;

a compressed air pipeline disposed on a side of the rinsing portion and communicated with the rinsing portion, wherein the compressed air pipeline is configured to transport and store compressed air to purge the silicon bar;

a reuse water pipeline disposed on another side of the rinsing portion opposite to the compressed air pipeline and communicated with the rinsing portion, wherein the reuse water pipeline is configured to transport and store reuse water to rinse the silicon bar;

a plurality of water-air ejecting holes, wherein the plurality of water-air ejecting holes are disposed at the lower end of the rinsing portion, communicated with the compressed air pipeline and the reuse water pipeline, and configured to eject the reuse water and the compressed air from the lower end of the rinsing portion toward the silicon bar at different times in sequence, so as to rinse and purge the silicon bar at different times in sequence; and a control unit disposed on an upper end of the rinsing portion and configured to control turning on or off of the silicon bar rinsing device.

2. The silicon bar rinsing device according to claim 1, wherein the water-air ejecting holes are uniformly spaced.

3. The silicon bar rinsing device according to claim 1, wherein the adjusting portion comprises:

two first connecting rods respectively disposed on left and right sides inside the rinsing portion, wherein upper ends of the first connecting rods are fixedly connected to the upper end of the rinsing portion;

two second connecting rods, wherein an upper end of each of the second connecting rods is moveably connected to one of the first connecting rods, and lower ends of the second connecting rods are fixedly connected to the lower end of the rinsing portion, and moving the second connecting rods is capable to drive the lower end of the rinsing portion to move, so as to change the position and the angle of the lower end of the rinsing portion.

4. The silicon bar rinsing device according to claim 1, wherein the adjusting portion comprises:

two first connecting rods respectively disposed on left and right sides inside the rinsing portion, wherein upper ends of the first connecting rods are fixedly connected to the upper end of the rinsing portion;

two second connecting rods, wherein an upper end of each of the second connecting rods is moveably connected to one of the first connecting rods, and lower ends of the second connecting rods are fixedly connected to the lower end of the rinsing portion, and moving the second connecting rods is capable to drive the lower end of the rinsing portion to move, so as to change the position and the angle of the lower end of the rinsing portion.

5. The silicon bar rinsing device according to claim 2, wherein the adjusting portion comprises:

two first connecting rods respectively disposed on left and right sides inside the rinsing portion, wherein upper ends of the first connecting rods are fixedly connected to the upper end of the rinsing portion;

two second connecting rods, wherein an upper end of each of the second connecting rods is moveably connected to one of the first connecting rods, and lower ends of the second connecting rods are fixedly connected to the lower end of the rinsing portion, and moving the second connecting rods is capable to drive the lower end of the rinsing portion to move, so as to change the position and the angle of the lower end of the rinsing portion.

6. The silicon bar rinsing device according to claim 3, wherein a length of each of the second connecting rods is less than or equal to one half of a length of each of the first connecting rods.

7. The silicon bar rinsing device according to claim 4, wherein a length of each of the second connecting rods is less than or equal to one half of a length of each of the first connecting rods.

8. The silicon bar rinsing device according to claim 5, wherein a length of each of the second connecting rods is less than or equal to one half of a length of each of the first connecting rods.

9. The silicon bar rinsing device according to claim 1, wherein the control unit comprises:

a solenoid valve disposed at the upper end of the rinsing portion, and configured to control transport and ejection of the compressed air from the compressed air pipeline and the reuse water from the reuse water pipeline.

10. The silicon bar rinsing device according to claim 1, wherein the control unit comprises:

a solenoid valve disposed at the upper end of the rinsing portion, and configured to control transport and ejection of the compressed air from the compressed air pipeline and the reuse water from the reuse water pipeline.

11. The silicon bar rinsing device according to claim 2, wherein the control unit comprises:

a solenoid valve disposed at the upper end of the rinsing portion, and configured to control transport and ejection of the compressed air from the compressed air pipeline and the reuse water from the reuse water pipeline.

12. The silicon bar rinsing device according to claim 9, wherein the solenoid valve is a direct-acting solenoid valve.

13. The silicon bar rinsing device according to claim 10, wherein the solenoid valve is a direct-acting solenoid valve.

14. The silicon bar rinsing device according to claim 11, wherein the solenoid valve is a direct-acting solenoid valve.

15. The silicon bar rinsing device according to claim 1, wherein a length of the rinsing portion is greater than or equal to a length of the silicon bar to be rinsed.

16. The silicon bar rinsing device according to claim 1, wherein the adjusting portion, the compressed air pipeline, and the reuse water pipeline are detachably connected to the rinsing portion.

17. The silicon bar rinsing device according to claim 1, further comprising a sensor, wherein the sensor is configured to detect a residual humidity of the purged silicon bar and for feedback.

* * * * *